(12) United States Patent  
Graham

(10) Patent No.: US 6,690,151 B2
(45) Date of Patent: Feb. 10, 2004

(54) PHASE DETECTION CIRCUIT

(75) Inventor: Martin H. Graham, Berkeley, CA (US)

(73) Assignee: And Yet, Inc., Berkeley, CA (US)

( * ) Notice: Subject to any disclaimer, the term of this patent is extended or adjusted under 35 U.S.C. 154(b) by 0 days.

(21) Appl. No.: 10/097,362

(22) Filed: Mar. 12, 2002

(65) Prior Publication Data

US 2003/0173943 A1 Sep. 18, 2003

(51) Int. Cl.[7] .................... G01R 19/00; G01R 25/00
(52) U.S. Cl. .............. 324/66; 324/76.77; 324/107; 324/121 E
(58) Field of Search ............... 324/66, 86, 107, 324/108, 76.77, 76.52, 76.83, 121 E, 67, 521; 702/72, 65; 340/658

(56) References Cited

U.S. PATENT DOCUMENTS

| | | | | | |
|---|---|---|---|---|---|
| 4,636,720 | A | * | 1/1987 | Farr | 324/86 |
| 4,963,819 | A | * | 10/1990 | Clarke et al. | 324/126 |
| 5,420,503 | A | * | 5/1995 | Beha | 324/108 |
| 5,521,491 | A | * | 5/1996 | Najam | 324/86 |
| 6,144,925 | A | * | 11/2000 | Hofstetter | 702/72 |

* cited by examiner

*Primary Examiner*—Anjan K. Deb
(74) *Attorney, Agent, or Firm*—Blakely, Sokoloff, Taylor & Zafman LLP

(57) ABSTRACT

An apparatus is described for determining whether the power applied to two outlets is in phase or out of phase. Two plugs are used, one for engaging each of the outlets. A circuit coupled to both plugs includes a plurality of indicators, and in one embodiment two indicators indicate the presence of power at each of the plugs, and the third, whether the power is in phase or out of phase.

17 Claims, 2 Drawing Sheets

US 6,690,151 B2

PHASE DETECTION CIRCUIT

BACKGROUND OF THE INVENTION

This invention relates to the field of determining phase, particularly in power lines.

FIELD OF THE INVENTION

In the United States and elsewhere, most homes and many businesses are connected to a power grid which supplies two phase power on three lines. Each phase is a 180° apart, and typically each phase provides 120 volts AC, and 240 volts between the two "hot" lines.

In a typical household or small business, some receptacles provide 120 volts on one phase, and others 120 volts on the other phase. It is sometimes desirable to know whether receptacles are on the same or different phases. For instance, when data signals are communicated over a power line from one receptacle to another, it may be necessary to know if the receptacles are on the same power phase. In another application, capacitors are coupled across the power lines at receptacles to filter out unwanted high frequency signals in the power lines. In order to filter out signals in both phases of the power lines, it is necessary to know which receptacles are on the same or different phases.

As will be seen, the present invention provides a simple circuit for providing phase information.

SUMMARY OF THE INVENTION

An apparatus for determining the phase relationship between power signals on power lines is described. A first and a second plug are used for coupling to different power line outlets. A plurality of indicators are included on the apparatus. At least one of the indicators is coupled to a circuit to provide a signal to indicate when the phase difference between the power line signals at the first and second plugs are different. In one embodiment the first, second, and third indicator indicates the presence of power at the first and second plugs as well as the phase relationship. The indicators may be ordinary bulbs, such as neon bulbs.

DETAILED DESCRIPTION

A circuit for detecting the phase relationship between alternating current (AC) power lines is described.

Figure 1:
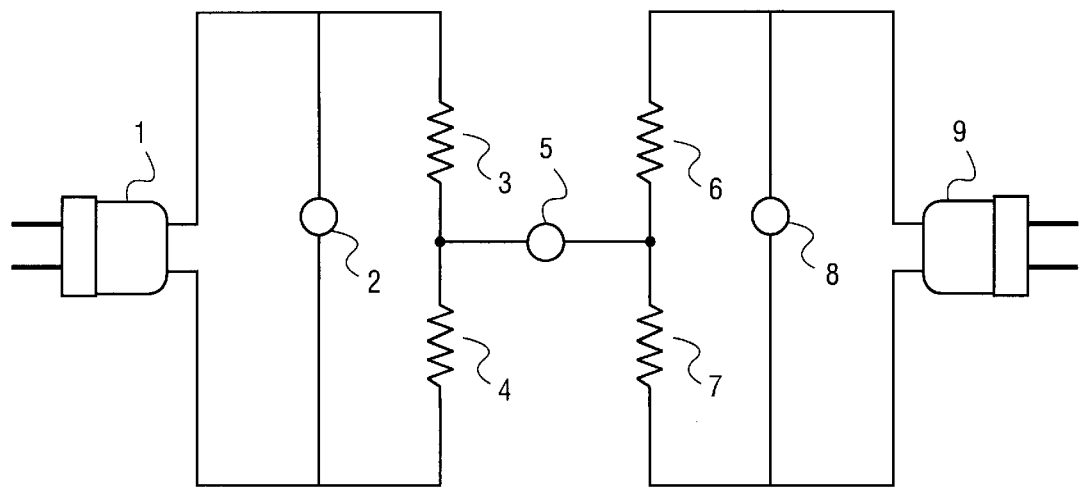
FIG. 1 is a circuit diagram of one embodiment of the present invention.

Referring now to FIG. 1, in this embodiment a circuit is coupled between a first plug 1 and a second plug 9. Each of the plugs are ordinary plugs for engaging 120 volt outlets, commonly used for 60 Hz AC power. A first, two terminal, indicator 2 is coupled across the plug 1, and similarly, a second indicator 8 is coupled across the plug 9. A voltage divider, shown as resistors 3 and 4, is also coupled across the leads of plug 1. Similarly, a voltage divider comprising resistors 6 and 7, is coupled across the leads of the plug 9. An indicator 5 is coupled between the common junctions of resistors 3–4 and 6–7.

The indicators in one embodiment are light bulbs or other sources of light, such as light emitting diodes (LEDs) or neon bulbs. Flag type indicators may also be used. The indicators should be low power consuming devices, for example, less than 1 watt.

The resistors 3, 4, 6, and 7 may be ordinary resistors having a resistance, for instance, of approximately 50K ohms each. The voltage dividers may also be fabricated from capacitors providing a relatively high impedance such as provided by the resistive voltage divider.

When the plugs 1 and 9 are inserted into outlets, the indicators 2 and 8, assuming they are bulbs, will illuminate provided there is a power signal present at the plugs. There will be no potential across the indicator 5 if the plugs 1 and 9 are receiving signals of the same phase. There will be 120 volt signal applied across the indicator 5, on the other hand, if the phase between the power on plugs 1 and 9 is different. Where the indicator is a bulb, it will illuminate to indicate that there is a phase difference between the power coupled to the plugs 1 and 9. Note that the circuit of FIG. 1 is not sensitive to which prong of the plug is inserted into the "hot" or neutral lines of the power line.

When either of the bulbs 2 or 8 fail to illuminate, then the illumination of bulb 5 does not indicate a phase difference. Rather, it may indicate that one of the plugs is not receiving power, or one of the bulbs is burned out.

Figure 2:
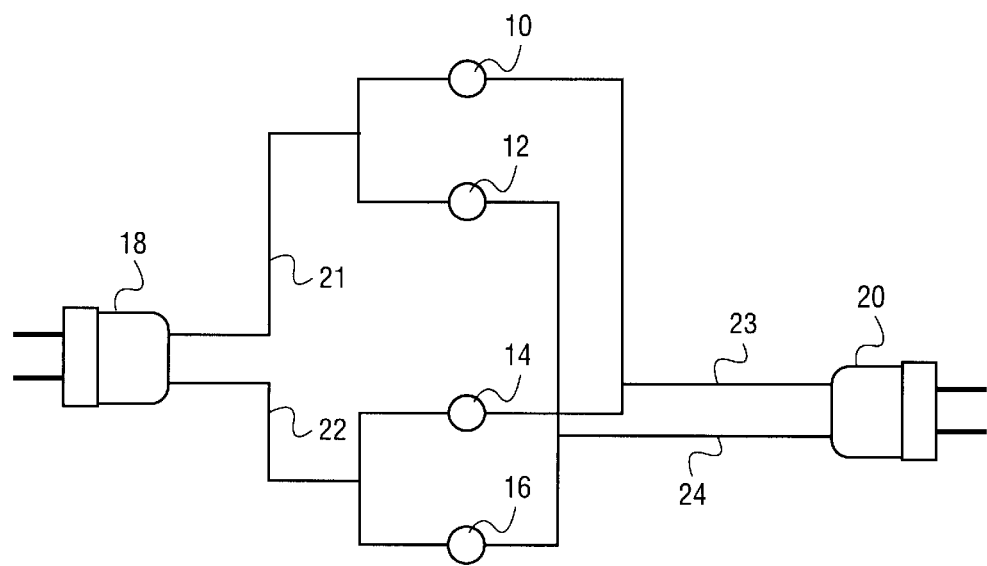
FIG. 2 is a circuit diagram of another embodiment of the invented circuit.

Referring now to FIG. 2, a circuit built in accordance with another embodiment of the present invention is illustrated and includes plugs 18 and 20, and indicators 10, 12, 14, and 16. The plugs 18 and 20 again may be ordinary 120 volt household plugs, commonly used for 60 Hz AC power.

One lead of plug 18 is coupled to one terminal of the indicators 10 and 12. The other lead, lead 22 of plug 18, is coupled to one terminal of the indicators 14 and 16. The other terminals of the indicators 10 and 12 are coupled to the leads 23 and 24, respectively of the plug 20. The other leads of the indicators 14 and 16 are also coupled to leads 23 and 24, respectively.

For this embodiment, the indicators are capable of handling a voltage of at least 240 volts rms. Thus, depending upon the voltage capabilities of, for instance, light bulbs that are used, resistors may need to be connected in series with the bulbs to protect them from too high a voltage.

In practice, plug 18 is inserted into one receptacle and plug 20 into another. Where the power in the receptacle is of the same phase, then two of the four indicators, 10, 12, 14, and 16 will have a potential across them. In contrast, three of the four indicators will have power across them if the plugs are receiving power of different phase. Where the indicators are bulbs, the illumination of two bulbs indicate the same phase, whereas the illumination of three lights indicates different phase.

Figure 3A:
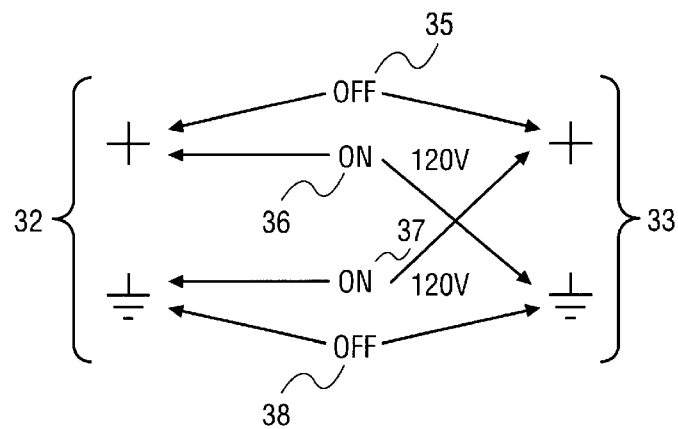
FIG. 3A is a diagram used to describe the voltage across the indicators for a same phase connection for the embodiment of FIG. 2.

Referring to FIG. 3A, the operation of the circuit of FIG. 2 is described in more detail for the case where the plugs are inserted into receptacles having the same phase of power. The bracket 32 is used to illustrate that one plug provides a plus potential with respect to a neutral line shown as a ground symbol. Similarly, the other plug is shown having a plus potential relative to a neutral or ground potential. Since the plugs are receiving the same phase power, the "+"

symbol represents the fact that between the plugs, the line remains at the same potential whether the waveform is positive or negative. The arrows emerging from the indicators 35, 36, 37, and 38, indicate the potential across the indicator. The status of those indicators, that is, in the case of a light, whether is it "on" or "off" is shown.

As can be seen at indicator 35, the connection of FIG. 2 (leads 21 and 23 of FIG. 2) are such that no potential difference is present at 35 and consequently, the indicator is off. In contrast, indicator 36 is connected between the positive line shown within brackets 32 and the ground line shown within brackets 33, consequently the indicator is on. Similarly, indicator 37 is ON, and indicator 38 is OFF. Thus, viewing FIG. 3A, two of the four indicators are on, two are off for the case where the plugs are receiving the same phase power.

Figure 3B:
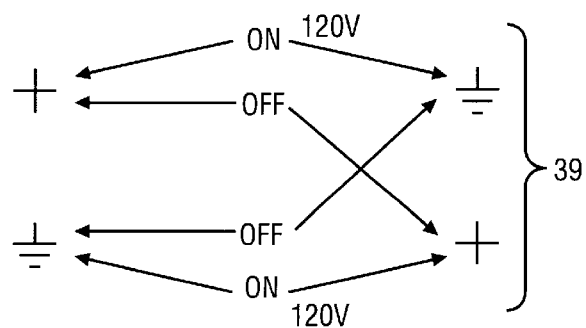
FIG. 3B is another diagram used to indicate the voltage across the indicators for a same phase connection for the embodiment of FIG. 2.

FIG. 3B illustrates the case where one of the plugs is reversed, that is, the neutral and the "hot" line are interchanged. Note within bracket 39, the ground symbol is on the top and the plus symbol is on the bottom. For this case, once again, two of the indicators are on and two are off, indicating that both plugs of the circuit are receiving power of the same phase. Note that in FIG. 3B, two different indicators would be illuminated when compared with FIG. 3A.

Figure 4A:
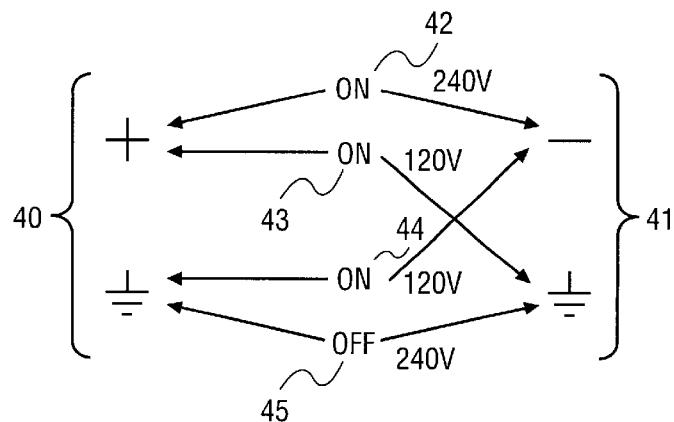
FIG. 4A is a diagram used to illustrate the voltage across the indicators for a different phase connection for the embodiment of FIG. 2.

In FIG. 4A, bracket 40 indicates that one plug is receiving one phase. Bracket 41, however, marked with a "-" and a ground symbol, indicate that this plug is receiving a different phase. The waveforms are a 180° out of phase for two phase power, and consequently this may be looked at as providing a positive potential on one lead, and a negative potential on the other. For this case, as shown, the indicator 42 is on since it receives a potential equal to 240 volts. The indicator 43 is also on, the potential across it however, is 120 volts. Similarly, the indicator 44 is also on since it's also receiving 120 volts, although a different phase than indicator 43. The indicator 45 is off. Thus, where there are different phases at the different plugs, three of the four indicators will be on.

Figure 4B:
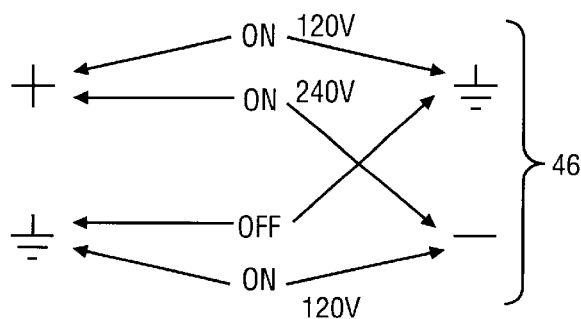
FIG. 4B is another diagram used to illustrate the voltage across the indicators for a different phase connection for the embodiment of FIG. 2.

In FIG. 4B, it is assumed that one of the plugs are reversed when compared to FIG. 4A and thus, as indicated by bracket 46, the ground potential is at the top of the bracket and the negative potential at the bottom. Once again for this configuration, three indicators are on.

It should be noted that with the embodiment of FIG. 2, false indications can arise if power is not present at either one of the plugs. For this reason, it is necessary to check that power is present at each of the plugs to prevent false indications.

The circuits of FIGS. 1 and 2 thus operate in an environment where the ground and "hot" leads are interchanged. Miswiring in homes and businesses is not uncommon and, what may appear to be the neutral line at the receptacle, may in fact be the "hot" line. If one could assume that the wiring at each receptacle is always correct, then only a single indicator is needed. For instance, only indicator 10 of FIG. 2 and leads 21 and 23 would be required, assuming leads 22 and 24 were the neutral leads.

Thus, a phase detection circuit has been disclosed.

What is claimed is:

1. An apparatus for determining the phase relationship between power signals on power lines comprising:
   a first and a second plug for coupling to power lines;
   a plurality of indicators; and
   a circuit fabricated entirely from passive components for providing a signal to a first one of the indicators if the phase relationship between the power signals coupled to the first and second plugs are different.

2. The apparatus defined by claim 1, wherein the first indicator is a bulb and the passive components are resistors.

3. The apparatus defined by claim 1, including a second and third indicator, the second indicator being coupled across the first plug, and the third indicator being coupled across the second plug, said second and third indicators indicating the presence of a power signal on their respective plugs.

4. The apparatus defined by claim 3, wherein the first, second, and third indicators are bulbs and the passive components are resistors.

5. An apparatus for determining the phase relationship between power line signals comprising:
   a first and a second plug;
   a first voltage divider entirely of passive components coupled across the first plug;
   a second voltage divider entirely of passive components coupled across the second plug;
   an indicator coupled between the voltage dividers.

6. The apparatus defined by claim 5, wherein the indicator is a bulb.

7. The apparatus defined by claim 6, including a second and a third indicator, the second indicator being coupled across the first plug, and the third indicator being coupled across the second plug, the second and third indicators providing an indication of a power signal on their respective plugs.

8. The apparatus defined by claim 7, wherein the passive components are resistors.

9. The apparatus defined by claim 8, wherein four resistors are used, two in each of the voltage dividers.

10. The apparatus defined by claim 7, wherein the passive components are capacitors.

11. A circuit for determining phase relationship between power lines comprising:
    a first indicator coupled between a first lead of a first line and a first lead of a second line,
    a second indicator coupled between a first lead of the first line and a second lead of a second line,
    a third indicator coupled between a second lead of the first line and the first lead of the second line, and
    a fourth indicator coupled between the second lead of the first line and the second lead of the second line.

12. The circuit defined by claim 11, wherein the indicators are flags.

13. The circuit defined by claim 12, wherein the indicators are sources of light.

14. The circuit defined by claim 11, wherein the first line and second line are each coupled to a plug.

15. The circuit defined by claim 14, wherein the indicators each comprise a light bulb.

16. A circuit for determining phase relationship between power lines comprising:
    four indicators each having two terminals,
    a first plug having first and second leads,
    a second plug having first and second leads,
        the first lead of the first plug being coupled to one terminal of two of the indicators,
        the other terminals of the two indicators being coupled to different ones of the first and second leads of the second plug, and
        the terminals of the other two indicators being coupled to the second lead of the first plug with the other terminals of the other indicators each being coupled to different ones of the first and second leads of the second plug.

17. The circuit defined by claim 16, wherein the indicators comprise sources of light.

* * * * *